United States Patent [19]
Kamiya et al.

[11] Patent Number: 5,851,909
[45] Date of Patent: Dec. 22, 1998

[54] METHOD OF PRODUCING SEMICONDUCTOR DEVICE USING AN ADSORPTION LAYER

[75] Inventors: Masaaki Kamiya; Kenji Aoki; Naoto Saito, all of Tokyo, Japan

[73] Assignee: Seiko Instruments Inc., Chiba, Japan

[21] Appl. No.: 6,152

[22] Filed: Jan. 19, 1993

Related U.S. Application Data

[63] Continuation of Ser. No. 821,318, Jan. 13, 1992, abandoned, which is a continuation of Ser. No. 565,221, Aug. 10, 1990, abandoned.

[51] Int. Cl.$^6$ ............................................. H01L 21/225
[52] U.S. Cl. ......................... 438/567; 438/307; 438/974
[58] Field of Search ............................ 437/164; 438/303, 438/305, 306, 307, 558, 563, 567, 906, 974

[56] References Cited

U.S. PATENT DOCUMENTS

| | | | |
|---|---|---|---|
| 3,247,032 | 4/1966 | Griswold | 437/164 |
| 3,506,508 | 4/1970 | Nickl | 437/225 |
| 4,242,691 | 12/1980 | Kotani et al. | 257/327 |
| 4,395,433 | 7/1983 | Nagakubo et al. | 437/19 |
| 4,441,932 | 4/1984 | Akasaka et al. | 437/31 |
| 4,465,529 | 8/1984 | Arima et al. | 437/165 |
| 4,737,471 | 4/1988 | Shirato et al. | 437/953 |

(List continued on next page.)

FOREIGN PATENT DOCUMENTS

| | | | |
|---|---|---|---|
| 0322921 | 5/1989 | European Pat. Off. | 437/160 |
| 316165A3 | 5/1989 | European Pat. Off. | |
| 0413982 | 2/1991 | European Pat. Off. | |
| 62-271479 | 11/1987 | Japan | |
| 0166219 | 7/1988 | Japan | |
| 0166220 | 7/1988 | Japan | |
| 63-239939 | 10/1988 | Japan | |
| 1192159 | 8/1989 | Japan | |
| 1384206 | 2/1975 | United Kingdom | |

| | | | |
|---|---|---|---|
| 8201380 | 4/1982 | WIPO | |

OTHER PUBLICATIONS

Leung, D.L., et al., "CMOS Devices Fabricated in Thin Epitaxial Silicon on Oxide", 1989 IEEE SOS/SOI Technology Conference Oct., 1989, pp. 74–75.

"Metal–Oxide–Silicon Field–Effect Transistor Made by Means of Solid–Phase Doping", by Gong et al.,; J. Appl. Phys. 65 (11), 1 Jun. 1989.

"Ultrashallow, high doping of boron using molecular layer doping"; by Nishizawa; Applied Physics Letters; 56(1990) 2 Apr., No. 14.

Wolf et al., "Silicon Processing for the VLSI Era", pp. 264–265, 1986.

Nishizawa—Single—Structured PMOSFET Fabricated Using Molecular Layer Doping, IEEE Electron Device Letters, 11 (1990) Mar., No. 3, New York, US.

S.F. Gong, et al., "A metal–oxide–silicon field–effect transistor . . . " *Journal of Applied Physics*, vol. 65, No. 11, Jun. 1, 1989, pp. 4435–4437.

T. Makino, et al., "A stacked–source–drain MOSFET using selective epitaxy", *Extended Abstracts/Spring Meeting*, vol. 88–1, 15–20 May, 1988, pp. 301–302.

Translation (English) of JP 63–16620.

Ito, T., "UV Epitaxy Applied to make transistor", Nikkei High Tech Report, vol. 4, No. 7, p. 10, Feb. 13, 1989.

Ghandi, S.K., VLSI Fabrication Principles, pp. 231–234, 1983.

Wolf, S., Silicon Processing for the VLSI Era, vol. 1, pp. 133–136, 142–143, 1986.

*Primary Examiner*—Chandra Chaudhari
*Attorney, Agent, or Firm*—Loeb & Loeb LLP

[57] ABSTRACT

An impurity adsorption layer is formed on a substrate surface and solid-phase thermal diffusion is carried out to form source and drain regions for a metal-insulator-semiconductor field-effect-transistor having lightly doped drain structure or double doped drain structure. The thus formed impurity-doped region is ultrashallow, thereby producing high speed semiconductor devices of small dimensions.

28 Claims, 9 Drawing Sheets

| | | | |
|---|---|---|---|
| 4,791,074 | 12/1988 | Tsunashima | 437/160 |
| 4,855,258 | 8/1989 | Allman et al. | 437/939 |
| 4,861,729 | 8/1989 | Fuse et al. | 437/165 |
| 4,907,048 | 3/1990 | Huang | 357/23.4 |
| 4,937,205 | 6/1990 | Nakayama et al. | 437/165 |
| 4,939,103 | 7/1990 | Szolgyemy | 437/165 |
| 4,940,505 | 7/1990 | Schachameyer et al. | 437/946 |
| 4,951,601 | 8/1990 | Maydan et al. | 118/719 |

OTHER PUBLICATIONS

METHOD OF PRODUCING SEMICONDUCTOR DEVICE USING AN ADSORPTION LAYER

This is a continuation of application Ser. No. 07/821,318 filed on Jan. 13, 1992, now abandoned, itself a continuation of application Ser. No. 07/565,221 filed on Aug. 10, 1990, also abandoned.

BACKGROUND OF THE INVENTION

FIELD OF THE INVENTION

The present invention relates to a method of producing a semiconductor device in the form of a metal insulator semiconductor field effect transistor (hereinafter, referred to as a "MISFET") used in electronic instruments such as computers.

With regard to P type MISFETs of the conventional lightly doped drain (hereinafter, referred to as "LDD") structure, as shown in FIGS. 9A–9F, a gate oxide film 102 and a gate electrode 103 are sequentially formed on an N type silicon substrate 101. Thereafter, boron 113 of P type impurity is implanted in the surface of the N type silicon substrate 101 by ion implantation using gate electrode 103 as a mask, so as to form low impurity density P⁻ type source region 105 and drain region 106. Then, a spacer 104 is formed along a side wall of the gate electrode 103. Thereafter, again boron of the P type impurity is implanted by ion implantation, using gate electrode 103 and spacer 104 as a mask, to form P⁺ type source region 107 and drain region 108 to thereby produce a MISFET of the LDD structure. Regions 107 and 108 are deeper, or thicker, than regions 105 and 106.

With regard to P type MISFETs of the conventional double doped drain (hereinafter,referred to as "DDD") structure, as shown in FIGS. 10A–10F, a gate oxide film 202 and a gate electrode 203 are sequentially formed on an N type silicon substrate 201. Thereafter, boron 213 of P type impurity is implanted into the surface of the N type silicon substrate 201 by ion implantation with using the gate electrode as a mask so as to form a thin P⁻ type source region 205 and drain 206.

Then, boron 215 of the P type impurity is implanted, again by ion implantation using the gate electrode 203 as a mask, to form high density P⁺ type source region 207 and drain region 208 to thereby produce a MISFET of the DDD structure.

However, since the source region and drain region are formed by ion implantation, the above noted conventional methods of producing the semiconductor device have the following drawbacks:

1. Since the impurity is diffused with a Gaussian distribution according to the acceleration energy of ions, a shallow impurity region cannot be formed.
2. Implantation of ions, i.e. charged particles, may damage a gate insulating film.
3. When forming a MISFET on a [100] face of a silicon crystal, channeling effects may be caused due to the ion implantation to thereby hinder formation of a shallow impurity region which would be needed to produce a fine MISFET.
4. Oblique ion implantation with an incident angle of about 70° has been proposed to prevent the above noted channeling effect. However, this oblique ion implantation may adversely cause asymmetricity of the impurity distribution in the source and drain regions in the vicinity of the gate electrode due to shadow effect, thereby causing the drawback that electric current characteristics of the MISFET will vary depending on the position of the gate electrode.
5. It is necessary to increase the impurity density in the surface portion of the source and drain regions so as to significantly reduce the contact resistance between a lead pattern layer and the source and drain regions. However, the ion implantation method cannot intensively raise the impurity density only in the surface portion of the source and drain regions.

In view of the above noted drawbacks, the conventional method cannot produce a fine structure of the semiconductor device having uniform characteristics.

SUMMARY OF THE INVENTION

In order to eliminate the above noted drawbacks, an object of the present invention is to form a low impurity density section of the source and drain regions by an impurity adsorption method to obtain an ultrashallow and uniform impurity region in a MISFET of the LDD structure. Another object of the invention is to form a high impurity density section of the source and drain regions by an impurity adsorption method at an ultrashallow depth with a very high density in a MISFET of the LDD or DDD structure.

According to the inventive method of producing a semiconductor device, a first step is carried out for forming a gate insulating film on a surface of a semiconductor region of a first conductivity type and for forming a gate electrode on the gate insulating film. Thereafter, a second step is undertaken for exposing an active face on a pair of semiconductor region sections spaced from each other by the gate electrode. Subsequently, a third step is effected for applying to the active face a gas containing an impurity component of a second conductivity type to form an impurity adsorption layer composed of impurity component atoms or compound containing at least impurity component atoms and for introducing impurity into the semiconductor region of the first conductivity type from a diffusion source composed of the impurity adsorption layer to thereby form a first impurity layer of low density in the surface of the pair of semiconductor region sections separated from one another by the gate electrode. Lastly, a fourth step is carried out for forming a second impurity layer having an impurity density higher than that of the first impurity layer in contiguous relation to the first impurity layer.

Preferably, the fourth step comprises introducing an impurity of the second conductivity type by implantation to form the second impurity layer. Otherwise, the fourth step comprises applying a gas containing an impurity component of the second conductivity type to form another impurity adsorption layer composed of impurity component atoms or a compound containing at least the impurity component atoms, and introducing the impurity into the first impurity layer from a diffusion source composed of the other impurity adsorption layer to form the second impurity layer of higher density.

The inventive method may include the step of forming a spacer along a side wall of the gate electrode between the third and fourth steps.

Further, preferably the third step comprises applying to the active face a gas containing a semiconductor component and an impurity component of the second conductivity type to form an adsorption layer composed of semiconductor component atoms and impurity component atoms, and introducing impurity into the semiconductor region of the first conductivity type from a diffusion source composed of the adsorption layer to form the first impurity layer of low density. Otherwise, the third step comprises forming an adsorption layer composed of an impurity sublayer having an impurity component of the second conductivity type and a semiconductor epitaxial sublayer, and introducing the impurity into the semiconductor region of the first conductivity type from a diffusion source composed of the adsorption layer to form the first impurity layer of low density.

According to another aspect of the inventive method of producing a semiconductor, the first step comprises forming a gate insulating film on a surface of a semiconductor of a first conductivity type and forming a gate electrode on the gate insulating film. Thereafter, the second step is carried out for introducing an impurity by ion implantation into a pair of sections of a semiconductor region separated by the gate electrode to form a first impurity layer. Subsequently, the third step is effected for exposing an active face of the ion-implanted semiconductor region. Lastly, the fourth step is undertaken for applying to the active face a gas containing an impurity component of a second conductivity type to form an impurity adsorption layer containing impurity component atoms or a compound having at lease impurity component atoms and for introducing an impurity into the first impurity layer from a diffusion source composed of the impurity adsorption layer to from a source region and a drain region of a second impurity layer having high density.

The inventive method may include the step of forming a spacer around a side wall of the gate electrode between the third and fourth steps.

The fourth step comprises, for example, applying to the active face a gas containing a semiconductor component and an impurity component of the second conductivity type to form an adsorption layer containing the semiconductor component atoms and the impurity component atoms, and introducing an impurity into the first impurity layer from a diffusion source composed of the adsorption layer to form the second impurity layer of high density. Otherwise, the fourth step comprises forming an adsorption layer composed at least of an impurity sublayer having an impurity component of the second conductivity type and a semiconductor epitaxial sublayer, and introducing an impurity into the first impurity layer from a diffusion source composed of the adsorption layer to form the second impurity layer of high density.

The above described impurity adsorption method is based on the fact that when applying to an activated semiconductor surface a gas containing an impurity element or impurity compound, the semiconductor surface chemically adsorbs the impurity element of the impurity compound. Consequently, the adsorption amount of the impurity can be controlled according to substrate temperature and charging amount of the gas containing the impurity element. Further, the impurity region is formed by diffusion from a diffusion source composed of the impurity adsorption layer formed on the semiconductor surface to thereby easily obtain uniform and shallow source and drain regions.

DESCRIPTION OF THE PREFERRED EMBODIMENTS FIRST EMBODIMENT

Hereinafter, various embodiments of the inventive method for producing a semiconductor device are described in conjunction with the drawings. FIGS. 1A–1F show a first embodiment of the invention in which an N type silicon substrate 1 is utilized as a base semiconductor. The impurity adsorption method is utilized to form both high impurity density regions and low impurity density regions in the LDD structure.

Figure 1A:
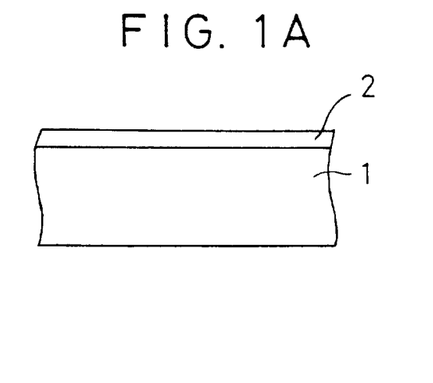
FIGS. 1A–1F are step sequence diagrams showing a first embodiment of the inventive method for producing a semiconductor device.
Figure 1B:
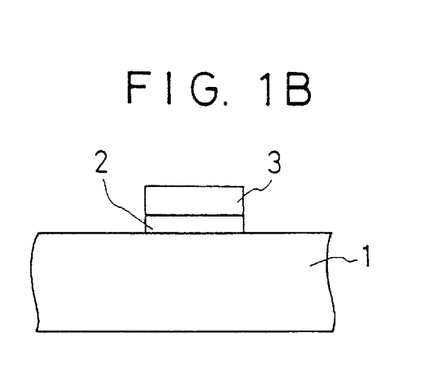
Figure 1C:
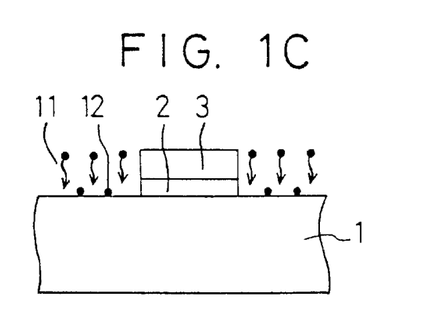
Figure 1D:
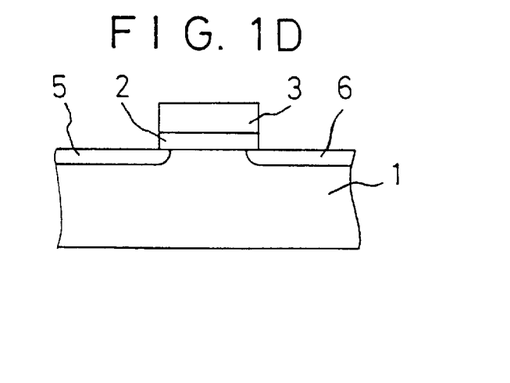

Firstly, in the FIG. 1A step, a gate oxide film 2 is formed on the N type silicon substrate 1. In the general fabrication process of an integrated circuit, another step may be carried out before the FIG. 1A step for forming an element isolation region etc. Next, in the FIG. 1B step, a gate electrode 3 is formed, and then the gate oxide film 2 is removed by etching in regions exposed by a mask in the form of gate electrode 3 or a photoresist used for forming the gate electrode 3 so as to expose a surface of the N type silicon substrate 1. Then in the FIG. 1C step, a boron compound gas 11 is applied to the exposed surface of the N type silicon substrate 1 to form a boron adsorption layer 12. Thereafter, in the FIG. 1D step, thermal treatment is carried out at a temperature of 700° C.–900° C. to thereby form a shallow $P^-$ type source region 5 and a shallow $P^-$ type drain region 6 where "$P^-$ type" indicates a relatively low impurity density or concentration.

Figure 1E:
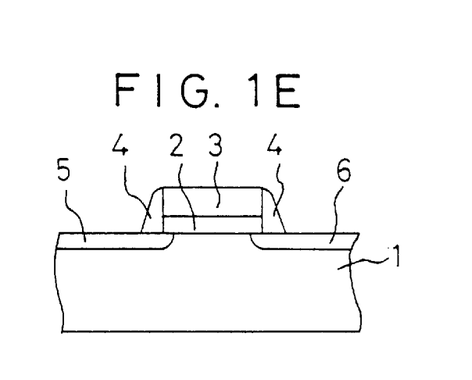
Figure 1F:
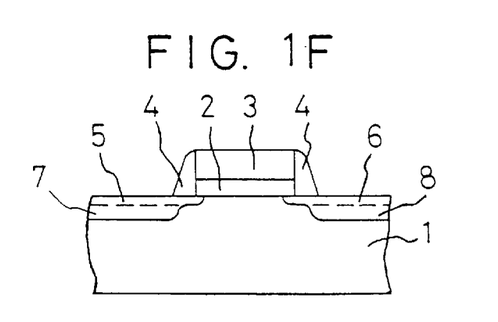

Then, in the FIG. 1E step, an insulating film is deposited over the structure and subsequently is removed by isotropic etching to form a spacer, or side wall film, 4 around the side wall of gate electrode 3. Thereafter in the FIG. 1F step, a boron layer of high density is formed in regions exposed by a mask in the form of gate electrode 3 and spacer 4 so as to form a P type MISFET of the LDD structure having $P^+$ type source region 7 and $P^+$ type drain region 8 where "$P^+$ type" indicates a relatively high impurity density. The $P^+$ type source region and $P^+$ type drain region could be formed by means of the ion implantation method; however, in this embodiment the $P^+$ type regions are formed by the same impurity adsorption method as used for the formation of the $P^-$ type source region and the $P^-$ type drain region. This impurity adsorption method facilitates the formation of source and drain regions having a shallow depth and an excellent distribution symmetricity of P type impurity, as compared to the ion implantation method.

Figure 2:
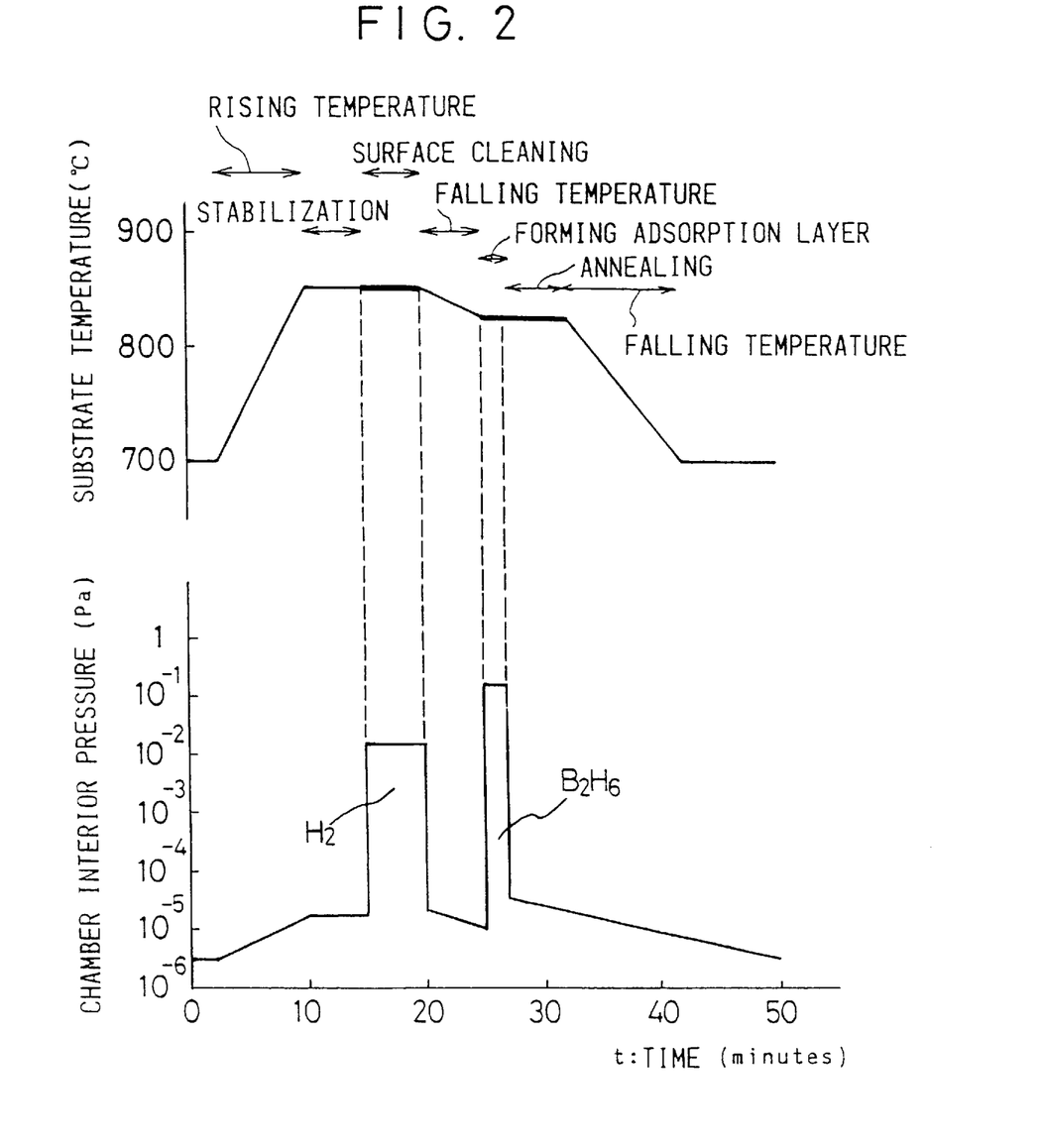
FIG. 2 is a process flow chart of the impurity adsorbing step of the embodiment of FIG. 1.
Figure 3:
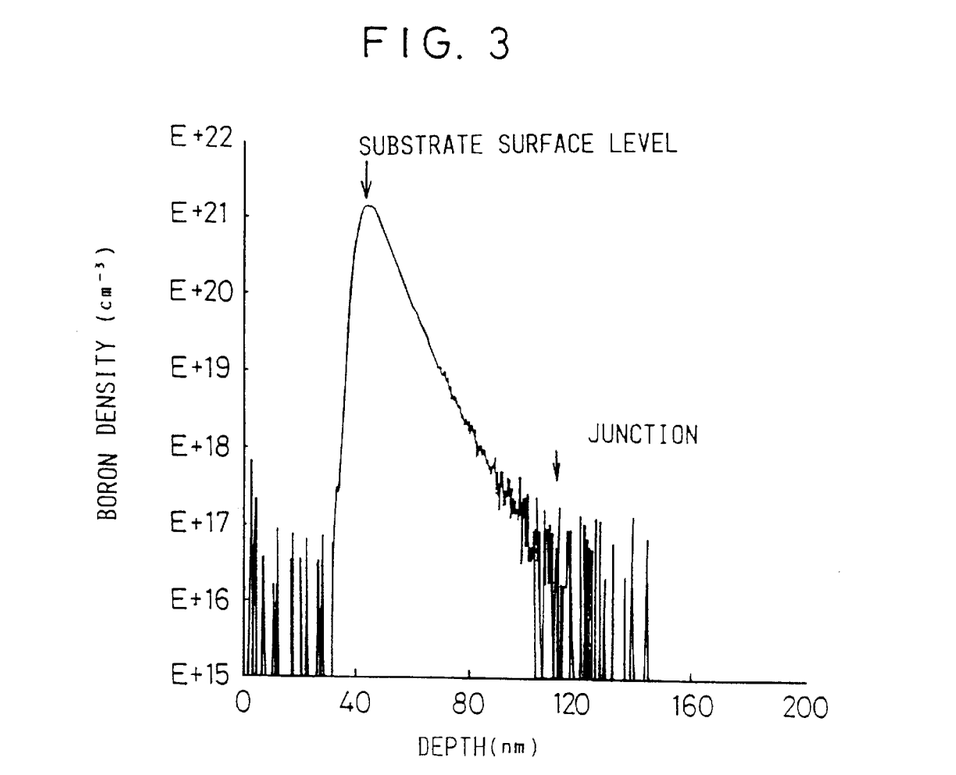
FIG. 3 is a depth profile of the impurity density in the semiconductor surface processed according to the FIG. 2 process.
Figure 4:
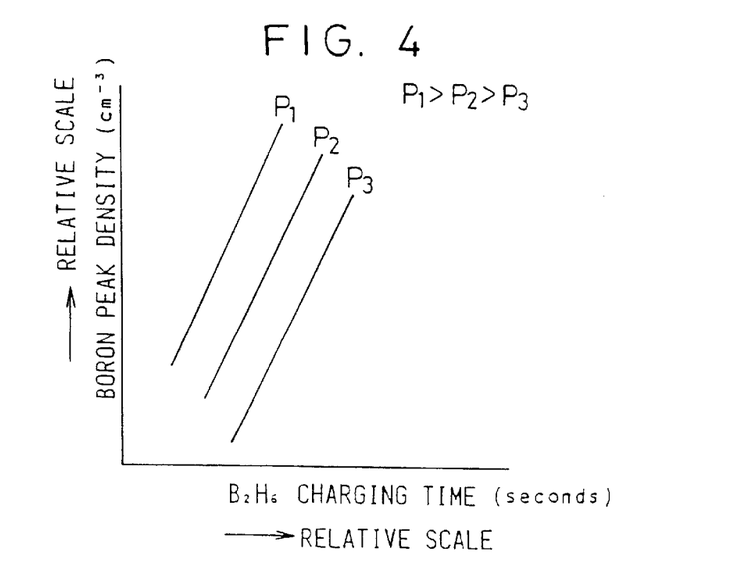
FIG. 4 is a graph showing dependency of boron peak density on charging time interval of $B_2H_6$ while the charging pressure of $B_2H_6$ gas is set as a parameter in the FIG. 2 process.
Figure 5A:
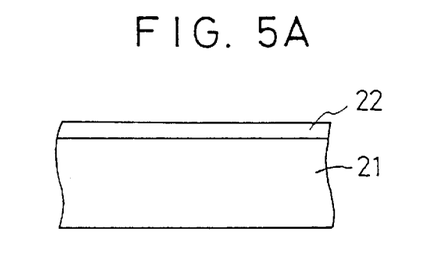
FIGS. 5A–5G are step sequence diagrams showing a second embodiment of the inventive method for producing a MISFET of the LDD structure.
Figure 5B:
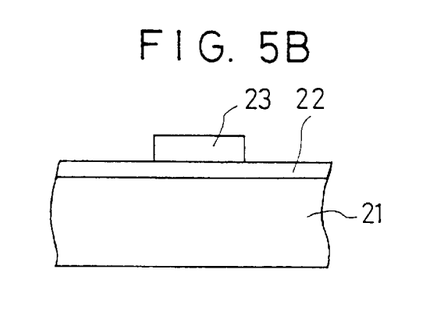
Figure 5C:
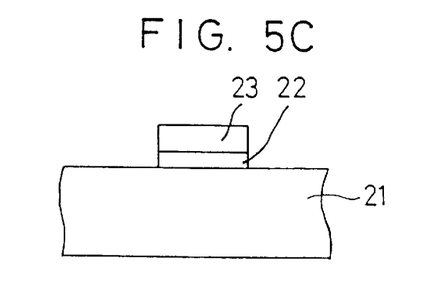
Figure 5D:
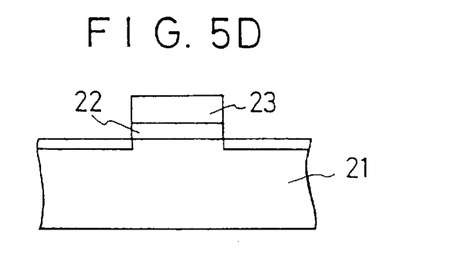
Figure 5E:
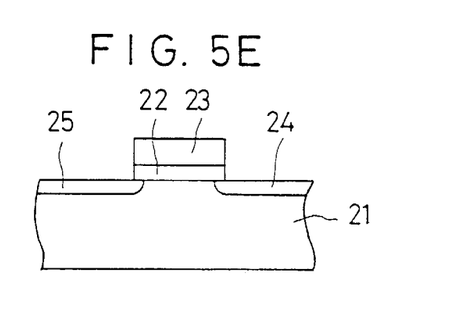
Figure 5F:
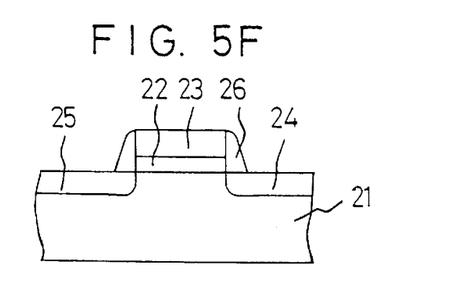
Figure 5G:
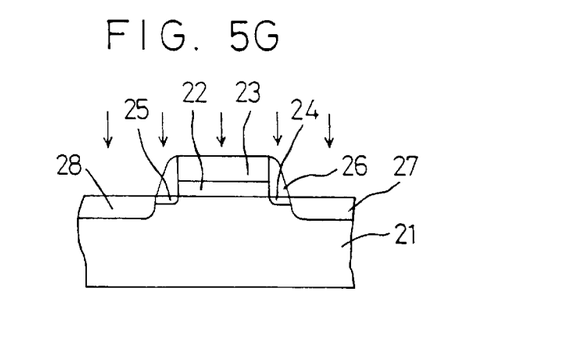

The next description is given for characteristics of the P type impurity layer formed by the impurity adsorption method with reference to FIGS. 2–4. FIG. 2 shows a process flow chart of the P type impurity region forming step. Firstly, a pressure below several mPa and a temperature of 700° are established. Thereafter, the semiconductor is exposed to an ambient temperature of about 800° C. After stabilizing the ambient condition for several minutes, a hydrogen gas is introduced at a pressure of about 10 mPa. This hydrogen gas is effective to remove a natural oxide film of about less than 30 Å thickness which has been formed on the exposed part of the silicon substrate after the preceding etching step, to thereby clean the substrate surface. Consequently, activated silicon atoms are exposed on the surface. Next, the ambient or substrate temperature is lowered for formation of an adsorption layer. A compound gas, such as diborane ($B_2H_6$), containing boron is introduced or charged to form a boron adsorption layer on the exposed surface of silicon substrate 1. This boron adsorption layer is formed substantially only on the exposed surface of silicon substrate 1 and on the gate electrode made of polysilicon etc., while the boron adsorption layer is not formed over an insulating film such as an oxide film.

FIG. 3 shows the depth distribution of the boron impurity concentration in the substrate surface obtained according to the FIG. 2 process sequence. It is found that a shallow impurity region can be easily formed with a depth of 700 Å with extremely high surface impurity density.

FIG. 4 shows the dependency of boron peak density on diborane charging time interval while the diborane charging pressure, P, is set as a parameter. It is found that the impurity adsorption method can controllably form an impurity region from low density to high density by adjusting the diborane charging pressure and the diborane charging time interval. However, in order to further increase the impurity density of the impurity region, the charging of diborane and annealing of the FIG. 2 process may be repeatedly carried out several times.

In other cases, diborane gas, dichlorosilane ($SiH_2Cl_2$) gas containing a semiconductor component and hydrogen gas are concurrently introduced to form an adsorption layer containing boron and silicon.

In the present embodiment shown in FIG. 1A–1F and FIG. 2, an annealing step is carried out immediately after forming the boron adsorption layer. However, the annealing treatment can be effected any time after the formation of the boron adsorption layer. For example, instead of the annealing treatment in the FIG. 1D step after forming the P⁻ type source and drain regions, another annealing may be carried out after the FIG. 1F step where the P⁺ type source and drain regions are formed. The annealing may be preferably carried out by a ramp annealing method or a radiation beam annealing method.

The first embodiment of the present invention is directed to a P type MISFET where boron is doped as an impurity. Boron has a diffusion coefficient greater than arsenic and phosphorus of the N type to thereby achieve significant effects according to the invention. However, it should be noted that the invention can be likewise applied to N type MISFETs in which an N type impurity such as antimony is used for the source and drain regions. Further, the inventive method of producing the semiconductor device can be applied not only to the semiconductor substrate surface, but also to the formation of MISFETs in a well region provided in the vicinity of the semiconductor substrate surface and to the formation of MISFETs in a silicon film disposed on an insulating substrate.

Moreover, solid-phase diffusion of the impurity can be effected from a diffusion source of an adsorption layer which contains at least one impurity adsorption layer composed of an impurity sublayer and semiconductor epitaxial sublayer. For example, diborane is firstly introduced at a gas pressure of about $1\times10^{-2}$ Pa for 100 seconds while maintaining the substrate temperature at 825° C. to form a boron adsorption sublayer on the N type silicon substrate surface. Then, a compound gas such as $SiH_2Cl_2$ and $SiH_4$ containing silicon is introduced while maintaining the substrate temperature at 700°–900° to form a silicon epitaxial sublayer on the boron adsorption sublayer. The silicon epitaxial sublayer can be selectively formed only on the silicon surface by using a chloride gas such as dichlorosilane or a gas mixture of $SiH_4$ and HCl. For example, dichlorosilane gas ($SiH_2Cl_2$) is introduced at a pressure of $1.3\times10^{-3}$ Pa for 13 minutes while maintaining the silicon substrate temperature at 825° C., to thereby form an about 50 Å thick silicon epitaxial sublayer. In this case, the film thickness of the silicon epitaxial sublayer should be controlled to be less than that of the gate oxide film so as to avoid electrical shorts between the silicon epitaxial sublayer and the gate electrode. As described, the boron adsorption sublayer and the silicon epitaxial sublayer are superposed with one another to facilitate diffusion of boron into the silicon to activate the boron.

SECOND EMBODIMENT

FIGS. 5A–5G show a second embodiment of the invention in which an N type silicon substrate is utilized as a semiconductor region. The impurity adsorption method is utilized to form low density impurity regions and an ion implantation method is utilized to form high density impurity regions in the LDD structure. According to this method, low density sections of the source and drain regions can be formed to be extremely shallow, while suppressing horizontal diffusion under the gate electrode. Firstly, in the FIG. 5A step, a gate oxide film 22 is formed on the N type silicon substrate 21. Next, in the FIG. 5B step, a gate electrode 23 is formed on the gate oxide film 22. then, in the FIG. 5C step, the gate oxide film 22 is removed by etching in the regions not covered by a mask in the form of the gate electrode 23 so as to expose a surface of the N type silicon substrate 21 to define source and drain regions. Then in the FIG. 5D step, a boron compound gas is applied to the exposed surface of the N type silicon substrate 21 to form a boron adsorption layer. Thereafter, in the FIG. 5E step, thermal treatment is carried out to form a shallow P⁻ type source region 25 and a shallow P⁻ type drain region 24 of low impurity density. Then, in the FIG. 5F step, an insulating $SiO_2$ side wall film 26 is deposited around a side wall of the gate electrode 23. Thereafter in the FIG. 5G step, further source region 28 and drain region 27 of high impurity density are formed by ion implantation around a mask in the form of the gate electrode 23 surrounded by $SiO_2$ film 26, so as to form a P type MISFET or metal-oxide-semiconductor transistor of the LDD structure.

Figure 6:
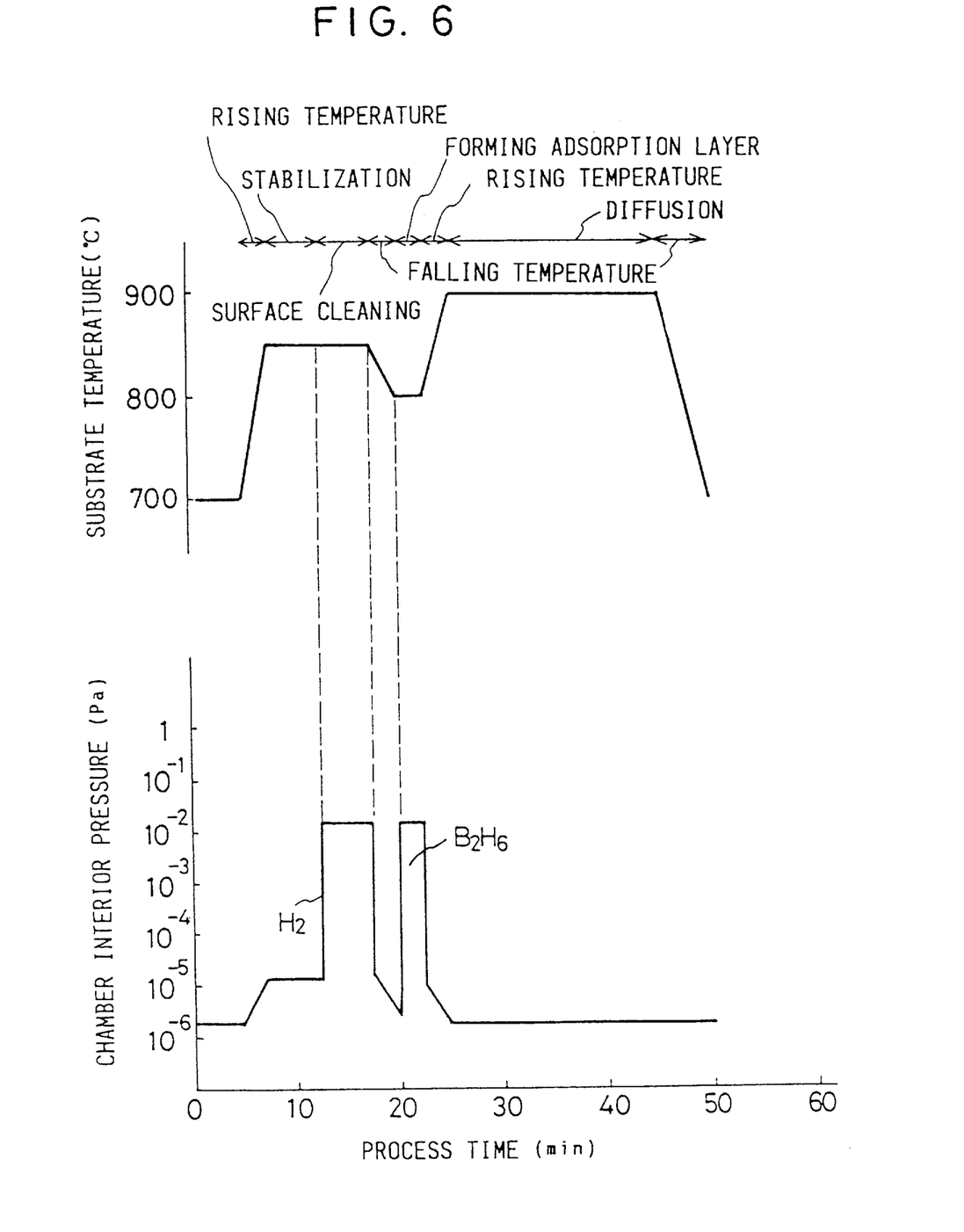
FIG. 6 is a process flow chart of the impurity doping step in the second embodiment.

FIG. 6 shows a process flow chart of the impurity region forming step for the low density source and drain. Firstly, the ambient pressure is lowered to below $1\times10^{-4}$ Pa, and the semiconductor is exposed to an ambient temperature of about 850° C. After stabilizing the ambient condition for several minutes, a hydrogen gas is introduced. This hydrogen gas is effective to remove a natural oxide film of about less than 30 Å thickness which has been formed on the exposed part of the silicon substrate 21, to thereby clean the substrate surface. Consequently, activated silicon atoms are exposed on the surface. Next, a compound gas, such as diborane ($B_2H_6$), containing boron is introduced or charged at about $1\times10^{-2}$ Pa of pressure to form a boron adsorption layer on the exposed surface of the silicon substrate 21. Lastly, the thermal treatment is effected to diffuse boron into the substrate to activate the boron to thereby form the low density impurity section of the source and drain regions.

According to the second embodiment of the invention for producing an MOS transistor of the LDD structure, the low impurity density section of the source and drain regions can be made shallow while avoiding horizontal diffusion under the gate electrode. Therefore, an effective distance can be maintained between the source and drain regions in registration with the gate length as opposed to that formed by the ion implantation method, thereby producing an improved MOS transistor of fine LDD structure.

The second embodiment of the present invention is directed to a P type MISFET where boron is doped as an impurity. Boron has a diffusion coefficient greater than arsenic and phosphorus of the N type to thereby achieve a significant effect according to the invention. However, it should be noted that the invention can be likewise applied to the N channel MOS transistor in which the N type impurity such as antimony is used for the source and drain regions. Further, the inventive method of producing a semiconductor device can be applied not only to a silicon substrate but also to a germanium substrate. Further, the gate insulating film is not limited to a gate oxide film.

THIRD EMBODIMENT

Hereinafter, a third embodiment of the inventive method for producing a semiconductor device is described in conjunction with FIGS. 7A–7F. The impurity adsorption method is utilized to form a high density impurity section of the source and drain regions in a MISFET of LDD structure to obtain an ultrashallow high impurity region. The above noted impurity adsorption method is based on the fact that a gas containing impurity atoms or an impurity compound is applied to an activated surface of the semiconductor so that the impurity atoms or compounds are chemically adsorbed on the semiconductor surface. Accordingly, the adsorbed amount of impurity can be controlled by the semiconductor substrate temperature and the charging amount of the impurity-containing gas. Further, the impurity region is formed by diffusion from a diffusion source composed of the impurity adsorption layer formed on the semiconductor surface, thereby easily obtaining source and drain regions in a quite shallow surface portion of the semiconductor with high impurity concentration.

Figure 7A:
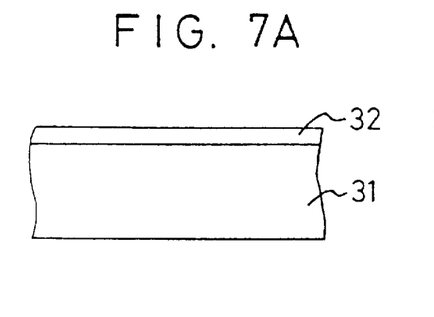
FIGS. 7A–7F are step sequence diagrams showing a third embodiment of the inventive method for producing a semiconductor device.
Figure 7B:
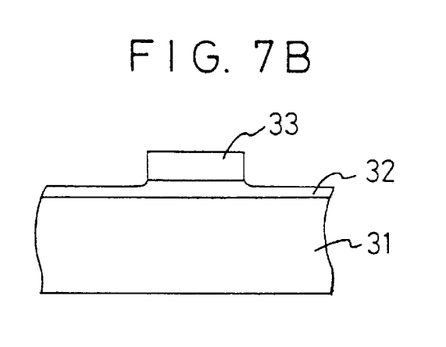
Figures 7C, 7F:
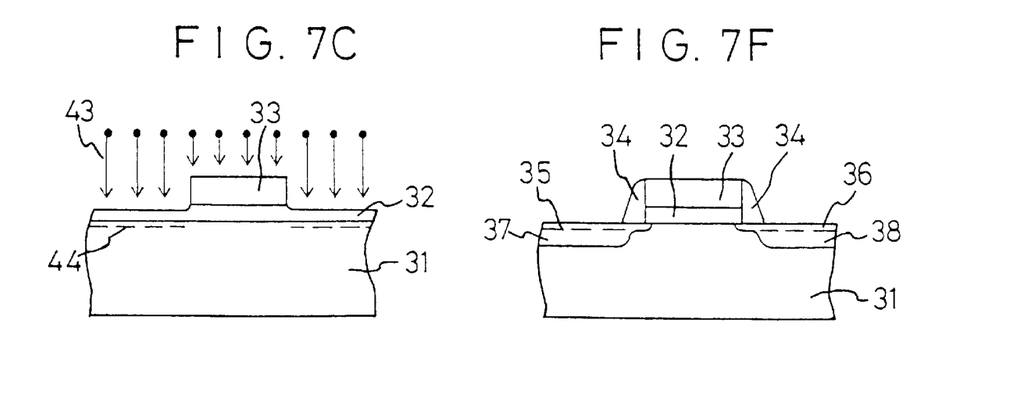
Figure 7D:
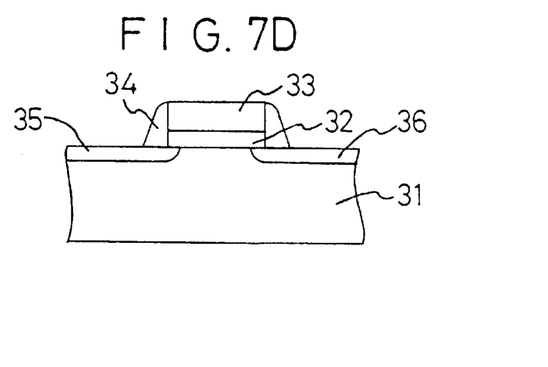
Figure 7E:
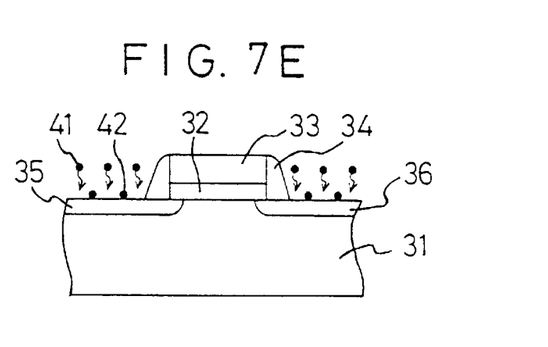

Firstly, in the FIG. 7A step, a gate oxide film 32 is formed on the N type silicon substrate 31. In the general fabrication process of an integrated circuit, another step may be carried out before the FIG. 7A step for forming an element isolation region, etc. Next, in the FIG. 7B step, a gate electrode 33 is formed on the gate oxide film 32. Next in the FIG. 7C step, boron is ion-implanted at areas exposed by a mask in the form of the gate electrode 33 or a photoresist used for making the gate electrode 33 so as to form a boron-injected layer 44 in the vicinity of the N type silicon substrate surface. Then, in the FIG. 7D step, an insulating film is deposited over the structure and subsequently is removed by isotropic etching to form a spacer, or side wall film, 34 around the wall of gate electrode 34. At this stage, the low impurity density sections of the source region 35 and drain region 36 are formed. The above described sequence of steps is similar to the conventional method of making a MISFET of the LDD structure. Subsequently, in the FIG. 7E step, a boron compound gas 41 is applied to the N type silicon substrate to form a boron adsorption layer 42 in a manner similar to the process shown in FIG. 6. Lastly, in the FIG. 7F step, thermal treatment is effected at 700°–900° to form $P^+$ type source region 37 and drain region 38 having a high boron density at a relatively shallow depth.

FOURTH EMBODIMENT

Lastly, a fourth embodiment of the inventive method for producing a semiconductor device is described in conjunction with FIGS. 8A–8F. The impurity adsorption method is utilized to form high impurity density source and drain regions in a MISFET of DDD structure to obtain shallow high impurity density regions.

Figure 8A:
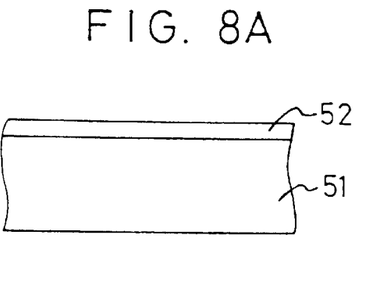
FIGS. 8A–8F are step sequence diagrams showing a fourth embodiment of the inventive method for producing a semiconductor device.
Figure 8B:
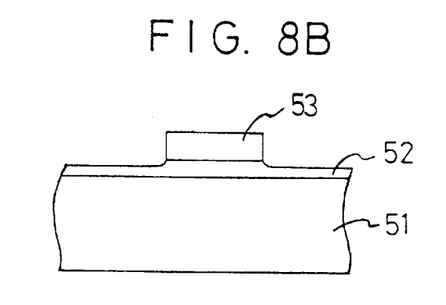
Figure 8C:
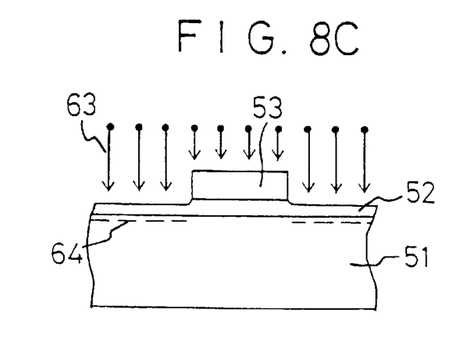
Figure 8D:
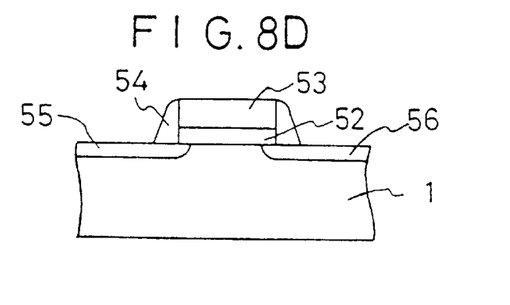

Firstly, in the FIG. 8A step, a gate oxide film 52 is formed on N type silicon substrate 51. In the general fabrication process of an integrated circuit, another step may be carried out before the FIG. 8A step for forming an element isolation region, etc. Next, in the FIG. 8B step, a gate electrode 53 is formed on gate oxide film 52. Then, in the FIG. 8C step, boron 63 is ion-implanted through openings in a mask in the form of the gate electrode 53 or a photoresist used for making the gate electrode 53 so as to form a boron-injected layer 64 in the vicinity of the surface of N type silicon substrate 5. Then, in the FIG. 8D step, thermal processing is effected to activate and boron from layer 64 to form a low impurity section of $P^+$ type source region 55 and drain region 56. The above described sequence of steps is similar to the conventional method of making a MISFET of DDD structure.

Figure 8E:
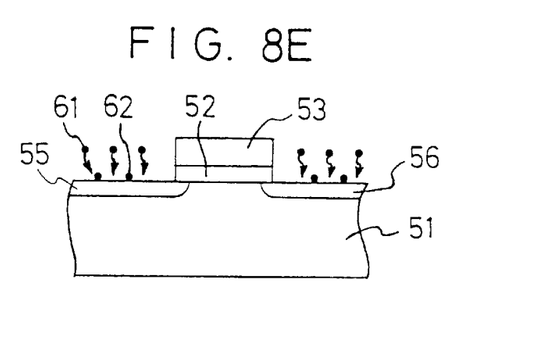
Figure 8F:
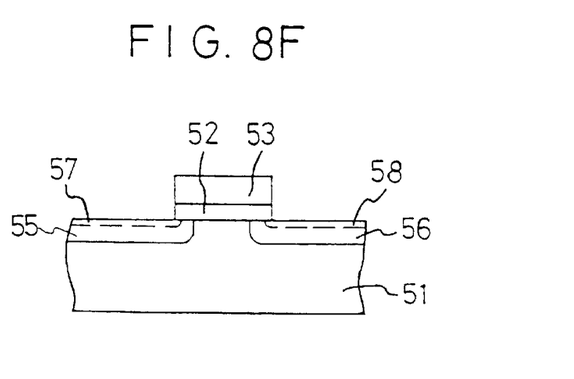
Figure 9A:
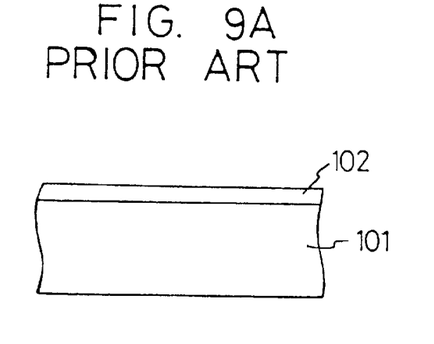
FIGS. 9A–9F are step sequence diagrams showing one type of conventional method for producing a semiconductor device.
Figure 9B:
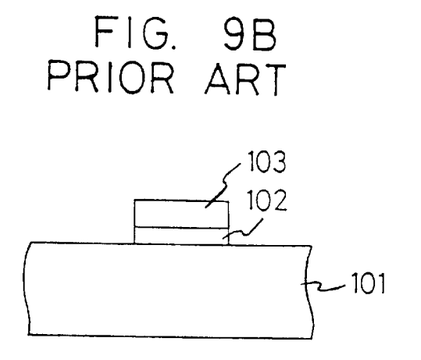
Figure 9C:
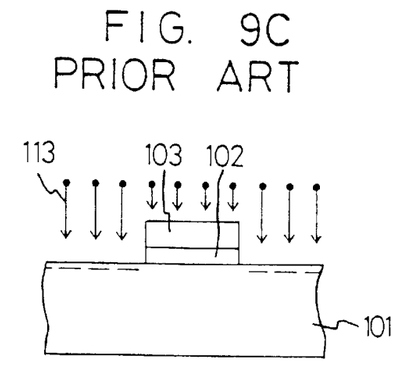
Figure 9D:
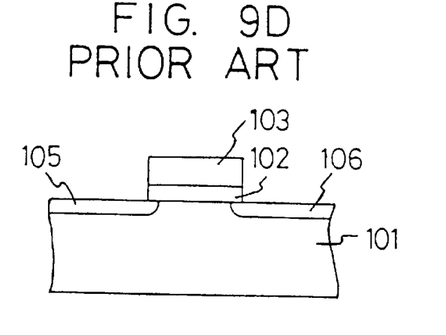
Figure 9E:
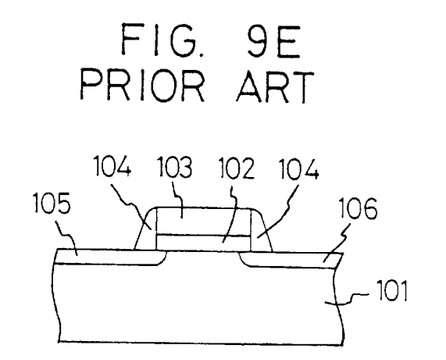
Figure 9F:
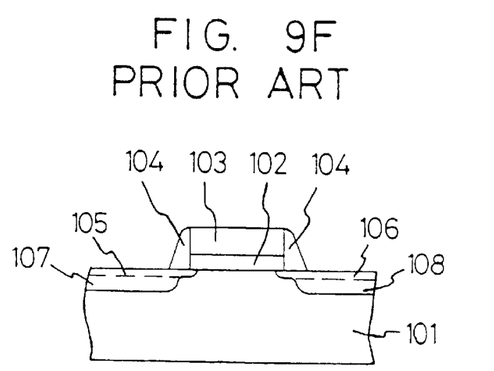
Figure 10A:
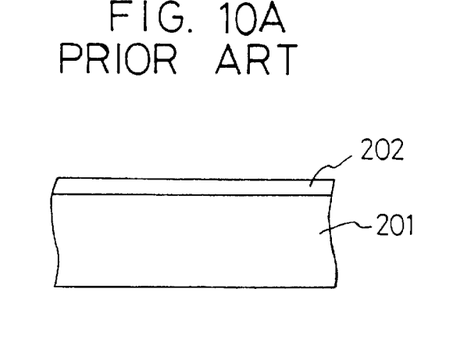
FIGS. 10A–10F are step sequence diagrams showing another type of conventional method.
Figure 10B:
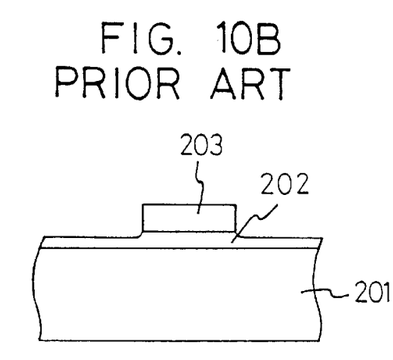
Figure 10C:
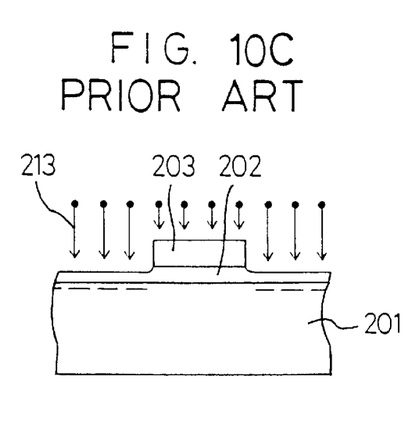
Figure 10D:
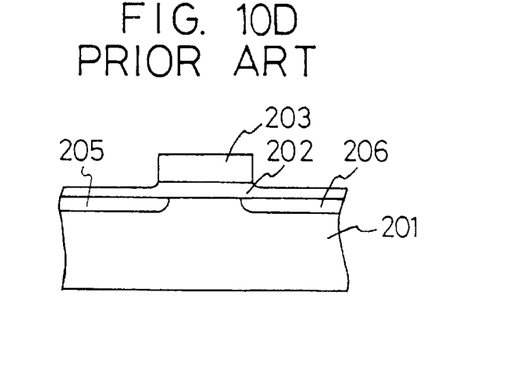
Figure 10E:
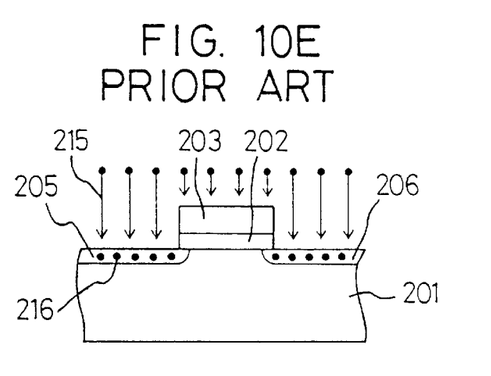
Figure 10F:
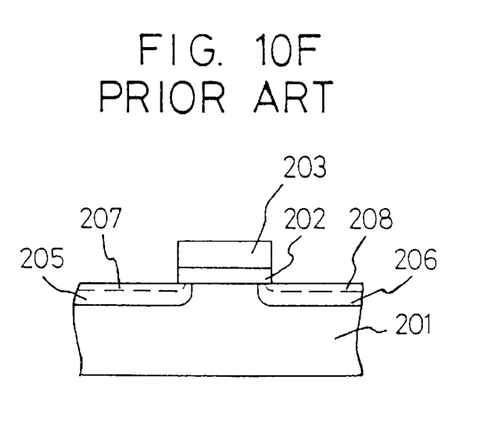

Subsequently, in the FIG. 8E step, insulating film 52 is removed from source region 55 and drain region 56 by etching to expose the silicon substrate surface, and a boron compound gas 61 is applied to the exposed surface of N type silicon substrate 51 to form a boron adsorption layer in a manner similar to the process shown in FIG. 6. Lastly, in the FIG. 8F step, the thermal treatment is effected at 700°–900° to form $P^+$ type source region 57 and drain region 58 having high boron density at a shallow depth.

As described above, according to the invention, the impurity adsorption method is utilized to form source and drain regions in a MISFET of LDD or DDD type, thereby obtaining uniform and shallow impurity-doped regions. Consequently, the inventive method can produce a semiconductor device which operates at high speed and has very small dimensions.

This application relates to subject matter disclosed in Japanese Application Numbers 1-209290 filed Aug. 11, 1989; 1-213183 filed Aug. 18, 1989; 1-231278 filed Sep. 6, 1989 and 1-277618 filed Oct. 25, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of producing a semiconductor device comprising:

a) forming a gate insulating film on a substrate at a surface of a semiconductor region of the substrate, the region being of a first conductivity type, and forming a gate electrode on the gate insulating film;

b) evacuating a chamber at a pressure of less than $1 \times 10^{-4}$ Pa;

c) removing an inert film from the substrate in the chamber by a reduction reaction in order to expose an active face on two sections of the semiconductor region spaced from each other by the gate electrode;

d) applying to the surface of the substrate in the chamber a gas containing an impurity component of a second conductivity type while heating the substrate to a temperature greater than 800° C. and not higher than a temperature of 825° C. to form an impurity adsorption layer composed of impurity component atoms or of a compound containing at least impurity component atoms and constituting a diffusion source substantially only on the active face, and introducing the impurity component atoms into the semiconductor region of the first conductivity type from the diffusion source to thereby form a first impurity layer of low density in the surface of the two semiconductor region sections; and e) forming a second impurity layer having an impurity density higher than that of the first impurity layer in each section so that the second layer is contiguous to the first impurity layer.

2. A method according to claim 1 wherein step e) comprises introducing an impurity of the second conductivity type by ion implantation to form the second impurity layer.

3. A method according to claim 1 wherein step e) comprises applying a gas containing an impurity component of the second conductivity type to form a second impurity adsorption layer composed of impurity component atoms or a compound containing at least the impurity component atoms and constituting a second diffusion source, and introducing impurity component atoms from the second diffusion source into the first impurity layer to form the second impurity layer of higher density.

4. A method according to claim 1 wherein the gate electrode has a side wall and further comprising forming a side wall film on the side wall of the gate electrode between steps d) and e).

5. A method according to claim 1 wherein step d) comprises applying to the active face a gas containing a semiconductor component and the impurity component of the second conductivity type to form the adsorption layer composed of semiconductor component atoms and impurity component atoms, and introducing the impurity component atoms into the semiconductor region of the first conductivity type from the adsorption layer to form the first impurity layer of low density.

6. A method according to claim 1 wherein step d) comprises forming at least one impurity adsorption layer composed of an impurity sublayer having the impurity component of the second conductivity type and a semiconductor epitaxial sublayer, and introducing the impurity into the semiconductor region of the first conductivity type from the impurity adsorption layer to form the first impurity layer of low density.

7. A method of producing a semiconductor device, comprising:

a) forming a gate insulating film on a surface of a region of a semiconductor substrate, the region being of a first conductivity type, and forming a gate electrode on the gate insulating film;

b) introducing an impurity by ion implantation into two sections of the semiconductor region, the sections being separated from one another by the gate electrode, to form a first impurity layer;

c) evacuating the chamber at a pressure of less than $1 \times 10^{-4}$ Pa;

d) removing an inert film from the substrate in the chamber by a reduction reaction in order to expose an active face of the ion-implanted semiconductor region; and e) applying to the surface of the substrate in the chamber a gas containing an impurity component of a second conductivity type while heating the substrate to a temperature greater than 800° C. and not higher than a temperature of 825° C. to form an impurity adsorption layer containing impurity component atoms and constituting a diffusion source substantially only on the active face, and introducing an impurity into the first impurity layer from the diffusion source to form a second impurity layer having a high impurity density in each section of the semiconductor region, the first and second layers forming a source and a drain in respective sections.

8. A method according to claim 7 wherein the gate electrode has a side wall and further comprising forming a side wall film on the side wall of the gate electrode between steps d) and e).

9. A method according to claim 7 wherein step e) comprises applying to the active face a gas containing a semiconductor component and the impurity component of the second conductivity type so that the adsorption layer contains the semiconductor component atoms and the impurity component atoms, and introducing the impurity into the first impurity layer from the adsorption layer to form the second impurity layer of high impurity density.

10. A method according to claim 7 wherein the impurity adsorption layer of step e) includes an impurity sublayer having the impurity component of the second conductivity type and a semiconductor epitaxial sublayer.

11. A method according to claim 7 wherein step e) is carried out to form a lightly doped drain structure.

12. A method according to claim 7 wherein step e) is carried out to form a double diffused drain structure.

13. A method as defined in claim 1 wherein step c) comprises removing a natural oxide film from sections of the semiconductor region in order to expose activated atoms of the material of the semiconductor region.

14. A method as defined in claim 13 wherein said step of removing comprises contacting the two sections of the semiconductor region with a gas selected to remove the natural oxide film.

15. A method as defined in claim 14 wherein the gas is hydrogen.

16. A method as defined in claim 14 wherein steps c) and d) are carried out in a controlled atmosphere and step d) is performed a short time after step c).

17. A method as defined in claim 16 wherein said step of introducing the impurity component atoms is carried out by performing a thermal treatment on the adsorption layer.

18. A method as defined in claim 7 wherein step d) comprises removing a natural oxide film from sections of the semiconductor region in order to expose activated atoms of the material of the semiconductor region.

19. A method as defined in claim 18 wherein said step of removing comprises contacting the two sections of the semiconductor region with a gas selected to remove the natural oxide film.

20. A method as defined in claim 18 wherein the gas is hydrogen.

21. A method as defined in claim 18 wherein steps d) and e) are carried out in a controlled atmosphere and step c) is performed a short time after step d).

22. A method as defined in claim 21 wherein said step of introducing the impurity component atoms is carried out by performing a thermal treatment on the adsorption layer.

23. A method of producing a semiconductor device comprising:
   a) forming a gate insulating film on a substrate at a surface of a semiconductor region of the substrate, the region being of a first conductivity type, and forming a gate electrode on the gate insulating film;
   b) evacuating the chamber at a pressure of less than $1 \times 10^{-4}$ Pa;
   c) removing an inert film from the substrate in the chamber by a heat treatment in order to expose an active face on two sections of the semiconductor region spaced from each other by the gate electrode;
   d) applying to the surface of the substrate in the chamber a gas containing an impurity component of a second conductivity type while heating the substrate to a temperature greater than 800° C. and not higher than a temperature of 825° C. to form an impurity adsorption layer composed of impurity component atoms or of a compound containing at least impurity component atoms and constituting a diffusion source substantially only on the active face, and introducing the impurity component atoms into the semiconductor region of the first conductivity type from the diffusion source to thereby form a first impurity layer of low density in the surface of the two semiconductor region sections; and
   e) forming a second impurity layer having an impurity density higher than that of the first impurity layer in each section so that the second layer is contiguous to the first impurity layer.

24. A method of producing a semiconductor device, comprising:
   a) forming a gate insulating film on a surface of a region of a semiconductor substrate, the region being of a first conductivity type, and forming a gate electrode on the gate insulating film;
   b) introducing an impurity by ion implantation into two sections of the semiconductor region, the sections being separated from one another by the gate electrode, to form a first impurity layer;
   c) evacuating the chamber at a pressure of less than $1 \times 10^{-4}$ Pa;
   d) removing an inert film from the substrate in the chamber by a heat treatment in order to expose an active face of the ion-implanted semiconductor region; and
   e) applying to the surface of the substrate in the chamber a gas containing an impurity component of a second conductivity type while heating the substrate to a temperature greater than 800° C. and not higher than a temperature of 825° C. to form an impurity adsorption layer containing impurity component atoms and constituting a diffusion source substantially only on the active face, and introducing an impurity into the first impurity layer from the diffusion source to form a second impurity layer having a high impurity density in each section of the semiconductor region, the first and second layers forming a source and a drain in respective sections.

25. A method according to claim 1 wherein the substrate is made of silicon and the gas is diborane.

26. A method according to claim 7 wherein the substrate is made of silicon and the gas is diborane.

27. A method according to claim 23 wherein the substrate is made of silicon and the gas is diborane.

28. A method according to claim 24 wherein the substrate is made of silicon and the gas is diborane.

* * * * *